United States Patent
Yoshida et al.

(10) Patent No.: US 10,822,691 B2
(45) Date of Patent: Nov. 3, 2020

(54) CU—GA ALLOY SPUTTERING TARGET AND METHOD OF MANUFACTURING CU—GA ALLOY SPUTTERING TARGET

(71) Applicant: MITSUBISHI MATERIALS CORPORATION, Tokyo (JP)

(72) Inventors: Yuki Yoshida, Naka (JP); Toshiaki Ueda, Tsukuba (JP); Satoru Mori, Naka (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 431 days.

(21) Appl. No.: 15/560,258

(22) PCT Filed: Mar. 10, 2016

(86) PCT No.: PCT/JP2016/057588
§ 371 (c)(1),
(2) Date: Sep. 21, 2017

(87) PCT Pub. No.: WO2016/158293
PCT Pub. Date: Oct. 6, 2016

(65) Prior Publication Data
US 2018/0066355 A1    Mar. 8, 2018

(30) Foreign Application Priority Data
Mar. 30, 2015  (JP) ................. 2015-069859
Jan. 29, 2016  (JP) ................. 2016-016122

(51) Int. Cl.
*C23C 14/34* (2006.01)
*H01L 31/032* (2006.01)
(Continued)

(52) U.S. Cl.
CPC .......... *C23C 14/3414* (2013.01); *B22F 3/105* (2013.01); *B22F 3/14* (2013.01);
(Continued)

(58) Field of Classification Search
CPC .......... B22F 1/0014; B22F 3/105; B22F 3/14; C22C 9/00; C23C 14/34; C23C 14/3414; H01L 31/0322
(Continued)

(56) References Cited

U.S. PATENT DOCUMENTS

2014/0001039 A1* 1/2014 Tamura .................. C22C 9/00
                                                                 204/298.13

FOREIGN PATENT DOCUMENTS

CN    102656291 A    9/2012
CN    102918003 A    2/2013
(Continued)

OTHER PUBLICATIONS

Machine Translation JP 2012-017481 (Year: 2012).*
(Continued)

*Primary Examiner* — Rodney G McDonald
(74) *Attorney, Agent, or Firm* — Locke Lord LLP; James E. Armstrong, IV; Nicholas J. DiCeglie, Jr.

(57) ABSTRACT

A Cu—Ga alloy sputtering target of the present invention is made of a Cu—Ga alloy, in which a carbon concentration is 30 ppm by mass or lower. In an observed structure, an area ratio of crystal grains having a grain size of 10 μm or less is 5% to 50% and an area ratio of crystal grains having a grain size of 100 μm or more is 1% to 30%.

4 Claims, 3 Drawing Sheets

(51) Int. Cl.
 *B22F 3/105* (2006.01)
 *B22F 3/14* (2006.01)
 *C22C 9/00* (2006.01)
 *B22F 1/00* (2006.01)

(52) U.S. Cl.
 CPC ............... *C22C 9/00* (2013.01); *C23C 14/34* (2013.01); *H01L 31/0322* (2013.01); *B22F 1/0014* (2013.01)

(58) Field of Classification Search
 USPC ....................................... 204/298.12, 298.13
 See application file for complete search history.

(56) References Cited

FOREIGN PATENT DOCUMENTS

| CN | 103421976 A | 12/2013 |
|---|---|---|
| EP | 2505686 A1 | 10/2012 |
| JP | 2000-073163 A | 3/2000 |
| JP | 2003-282908 A | 10/2003 |
| JP | 2012-017481 | * 1/2012 |
| JP | 2012-017481 A | 1/2012 |
| JP | 2012-031508 A | 2/2012 |
| JP | 2012-052190 A | 3/2012 |
| JP | 2013-209751 A | 10/2013 |
| JP | 2013-237908 A | 11/2013 |
| JP | 2014-019934 A | 2/2014 |
| JP | 2014-185392 A | 10/2014 |
| JP | 2014-210943 A | 11/2014 |
| WO | 2011/010529 A1 | 1/2011 |
| WO | 2011/013471 A1 | 2/2011 |

OTHER PUBLICATIONS

Supplementary European Search Report dated Aug. 13, 2018, issued for the European patent application No. 16772177.8.
Office Action dated Dec. 4, 2018, issued for the Chinese patent application No. 201680017581.7 and a partial English translation of the Search Report.
International Search Report dated May 24, 2016, issued for PCT/JP2016/057588 and English translation thereof.

* cited by examiner

CU—GA ALLOY SPUTTERING TARGET AND METHOD OF MANUFACTURING CU—GA ALLOY SPUTTERING TARGET

TECHNICAL FIELD

The present invention relates to a Cu—Ga alloy sputtering target used for forming a Cu—Ga alloy film by sputtering, and a method of manufacturing the Cu—Ga alloy sputtering target.

Priority is claimed on Japanese Patent Application No. 2015-069859, filed Mar. 30, 2015, and Japanese Patent Application No. 2016-016122, filed Jan. 29, 2016, the contents of which are incorporated herein by reference.

BACKGROUND ART

In the related art, as a thin-film solar cell formed of a compound semiconductor, a CIGS solar cell that includes a light-absorbing layer formed of a Cu—In—Ga—Se quaternary alloy thin film is widely provided.

As a method of forming the light-absorbing layer formed of a Cu—In—Ga—Se quaternary alloy thin film, a method of forming the light-absorbing layer using a vapor deposition method is known. A solar cell that includes a light-absorbing layer formed using a vapor deposition method has an advantageous effect in that the energy conversion efficiency is high, but has a problem in that the deposition rate is slow and the production efficiency is low.

Therefore, as a method of forming the light-absorbing layer formed of a Cu—In—Ga—Se quaternary alloy thin film, a method of forming a laminated film including an In film and a Cu—Ga film and performing a heat treatment on the laminated film in a Se atmosphere to selenize the laminated film, is provided. In order to form the In film and the Cu—Ga film, a sputtering method in which an In sputtering target and a Cu—Ga alloy sputtering target are used is applied.

The Cu—Ga alloy sputtering target is manufactured using a melting/casting method (for example, PTLs 1 and 2) or a powder-sintering method (for example, PTLs 3 and 4).

A Cu—Ga alloy sputtering target manufactured using a melting/casting method has an advantageous effect in that the oxygen concentration is low and the sputtering rate is fast, but has a problem in that segregation of Ga occurs during solidification and crystal grains are coarsened.

On the other hand, a Cu—Ga alloy sputtering target manufactured using a powder-sintering method has an advantageous effect in that the bending strength is high and the target is not likely to break during sputtering due to its fine structure, but has a problem in that the oxygen concentration is high and the sputtering rate is slow.

CITATION LIST

Patent Literature

[PTL 1] Japanese Unexamined Patent Application, First Publication No. 2000-073163
[PTL 2] Japanese Unexamined Patent Application, First Publication No. 2014-185392
[PTL 3] Republished Japanese Translation WO2011/010529 of the PCT International Publication for Patent Applications
[PTL 4] Republished Japanese Translation WO2011/013471 of the PCT International Publication for Patent Applications

SUMMARY OF INVENTION

Technical Problem

However, the Cu—Ga alloy sputtering target manufactured using a powder-sintering method has a problem in that the brittleness is high and breaking is likely to occur. In addition, in the Cu—Ga alloy sputtering target manufactured using a powder-sintering method, the amount of impurities is larger than that in the Cu—Ga alloy sputtering target manufactured using a melting/casting method. Therefore, during sputtering film formation, abnormal discharge may occur, particles may be formed, and the quality of a formed Cu—Ga alloy film may deteriorate.

The present invention has been made in consideration of the above-described circumstances, and an object thereof is to provide: a Cu—Ga alloy sputtering target in which breaking can be suppressed during manufacturing or use and in which abnormal discharge and particle formation can be suppressed during sputtering film formation; and a method of manufacturing the Cu—Ga alloy sputtering target.

Solution to Problem

In order to achieve the above-described object, according to the present invention, a Cu—Ga alloy sputtering target made of a Cu—Ga alloy is provided, in which a carbon concentration is 30 ppm by mass or lower, and, in an observed structure, an area ratio of crystal grains having a grain size of 10 µm or less is 5% to 50% and an area ratio of crystal grains having a grain size of 100 µm or more is 1% to 30%.

In the Cu—Ga alloy sputtering target according to the present invention having the above-described configuration, an area ratio of crystal grains having a grain size of 10 µm or less is 5% or higher and an area ratio of crystal grains having a grain size of 100 µm or more is 1% or higher. Therefore, the number of pores present in crystal grains can be reduced, and the bending strength can be improved. As a result, breaking can be suppressed during manufacturing or use.

In addition, the carbon concentration is limited to 30 ppm by mass or lower, and the area ratio of crystal grains having a grain size of 10 µm or less is limited to 50% or lower. Therefore, particle formation can be suppressed during sputtering film formation, and a high-quality Cu—Ga alloy film can be formed.

In addition, in the Cu—Ga alloy sputtering target according to the present invention, the area ratio of crystal grains having a grain size of 100 µm or more is limited to 30% or lower. Therefore, abnormal discharge during sputtering film formation can be suppressed. That is, the sputtering rate varies depending on crystal orientations. Therefore, as sputtering progresses, unevenness is formed on the sputtering surface due to the variation in sputtering rate. In a case where a large amount of crystal grains having a grain size of 100 µm or more are present, unevenness formed on the sputtering surface becomes significant, electric charges are concentrated on convex portions, and abnormal discharge is likely to occur. Therefore, by limiting the area ratio of the crystal grains having a grain size of 100 µm or more to 30% or lower, abnormal discharge can be suppressed.

In the Cu—Ga alloy sputtering target according to the present invention, it is preferable that an average crystal grain size be 100 µm or less.

In such case, unevenness formed on the sputtering surface along with the progress of sputtering can reliably be made small and thus abnormal discharge can be further suppressed.

In addition, in the Cu—Ga alloy sputtering target according to the present invention, it is preferable that an oxygen concentration be 150 ppm by mass or lower.

In such case, formation of an oxide in the Cu—Ga alloy sputtering target can be suppressed. Thereby, during sputtering film formation, concentration of electric charges on an oxide can be suppressed, and abnormal discharge can be suppressed.

According to the present invention, a method of manufacturing a Cu—Ga alloy sputtering target is provided, the Cu—Ga alloy sputtering target being the above-described Cu—Ga alloy sputtering target. This method includes a sintering step of sintering base powder, in which a carbon concentration in the base powder is 140 ppm by mass or lower, a proportion of grains having a grain size of 10 μor less in the base powder is 5% to 50% by volume, a proportion of grains having a grain size of 100 μm or more in the base powder is 1% to 30% by volume, and the base powder is sintered using a pulsed electric-current pressure sintering method in the sintering step.

In the method of manufacturing a Cu—Ga alloy sputtering target according to the present invention having the above-described configuration, the base powder is sintered using a pulsed electric-current pressure sintering method (also known as a spark plasma sintering method (SPS)). Therefore, the grain size of the base powder becomes the crystal grain size of the Cu—Ga alloy sputtering target without a significant change in the grain size of the base powder. Accordingly, in the base powder-preparing step, the proportion of grains having a grain size of 10 μm or less contained in the base powder is adjusted to be 5% to 50% by volume, and the proportion of grains having a grain size of 100 μm or more is adjusted to be 1% to 30% by volume. Thereby, a Cu—Ga alloy sputtering target can be manufactured in which the area ratio of crystal grains having a grain size of 10 μm or less is limited to 5% to 50% and the area ratio of crystal grains having a grain size of 100 μm or more is 1% to 30%.

In addition, the base powder is sintered using a pulsed electric-current pressure sintering method. Thus, when an electric current passes through point contact portions between grains of the base powder, the cross-sectional area of an electric-current path significantly decreases, and the current density significantly increases. Therefore, the amount of Joule heat generated significantly increases, the temperature of a local region reaches a high temperature at which plasma is generated such that carbon is removed from the region, and thus the amount of carbon can be reduced during sintering. Accordingly, by adjusting the amount of carbon in the base powder to be 140 ppm by mass or lower, a Cu—Ga alloy sputtering target in which the carbon concentration is 30 ppm by mass or lower can be manufactured.

In the method of manufacturing a Cu—Ga alloy sputtering target according to the present invention, it is preferable that in the sintering step, a sintering temperature $T_S$ be in a range of $0.5 \times T_L \leq T_S \leq T_L$ with respect to a liquid phase appearance temperature $T_L$ of a Cu—Ga alloy constituting a Cu—Ga alloy sputtering target to be manufactured, and a holding time be 0.5 min to 60 min.

In the method of manufacturing a Cu—Ga alloy sputtering target having the above-described configuration, the sintering temperature $T_S$ and the holding time are in the above-described ranges. Therefore, the base powder can reliably be sintered, and the melting of the base powder can be suppressed.

The liquid phase appearance temperature $T_L$ represents a liquidus line or the lower limit of a solid-liquid coexisting region in a phase diagram.

In addition, in the method of manufacturing a Cu—Ga alloy sputtering target according to the present invention, it is preferable that, in the sintering step, an applied pressure be 1 MPa to 100 MPa.

In the method of manufacturing a Cu—Ga alloy sputtering target having the above-described configuration, the applied pressure is 1 MPa or higher in the sintering step. Therefore, an electric current can reliably be passed through the base powder to heat the base powder. In addition, the applied pressure is 100 MPa or lower in the sintering step. Therefore, it is not necessary to use large pressing facilities, a Cu—Ga alloy sputtering target can be efficiently manufactured.

Further, in the method of manufacturing a Cu—Ga alloy sputtering target according to the present invention, it is preferable that an average grain size of the base powder be 100 μm or less.

In the method of manufacturing a Cu—Ga alloy sputtering target having the above-described configuration, the base powder is sintered using a pulsed electric-current pressure sintering method. Therefore, a Cu—Ga alloy sputtering target can be manufactured in which the average crystal grain size is 100 μm or less without a significant change in the grain size of the base powder.

In addition, in the method of manufacturing a Cu—Ga alloy sputtering target according to the present invention, it is preferable that, in the sintering step, using a mold including a cylindrical die and punches which are configured to be inserted into openings formed at opposite ends of the die, and a pressure be applied to the punches using a press machine while passing an electric current through the punches, and it is preferable that an auxiliary current-carrying member be disposed between the press machine and an end surface of the die in the vicinity of the punches.

In a case where the pulsed electric-current pressure sintering is performed using a mold including the punches and the die, cross-sectional areas perpendicular to a current-passing direction are different between a region where only the punch is provided and a region where the die is provided. Therefore, there may be a difference in temperature caused by Joule heat. Therefore, by providing the auxiliary current-carrying member in the vicinity of the punch such that the press machine and the die are electrically connected through the auxiliary current-carrying member, the generation of Joule heat in the region where only the punch is provided can be suppressed, and a difference in temperature can be suppressed. As a result, the local formation of a portion where sintering is insufficient can be suppressed, and the bending strength can be sufficiently improved.

Advantageous Effects of Invention

As described above, according to the present invention, it is possible to provide: a Cu—Ga alloy sputtering target in which breaking can be suppressed during manufacturing or use and in which abnormal discharge and particle formation can be suppressed during sputtering film formation; and a method of manufacturing the Cu—Ga alloy sputtering target.

DESCRIPTION OF EMBODIMENTS

Hereinafter, a Cu—Ga alloy sputtering target and a method of manufacturing a Cu—Ga alloy sputtering target according to an embodiment of the present invention will be described with reference to the accompanying drawings.

The Cu—Ga alloy sputtering target according to the present embodiment is used when a Cu—Ga alloy film is formed by sputtering in order to form, for example, a light-absorbing layer formed of a Cu—In—Ga—Se quaternary alloy thin film in a CIGS thin-film solar cell.

The Cu—Ga alloy sputtering target according to the present embodiment is made of a Cu—Ga alloy with a composition containing 20 at % to 40 at % of Ga and the balance being Cu and inevitable impurities.

In addition, a carbon concentration is 30 ppm by mass or lower, and an oxygen concentration is 150 ppm by mass or lower.

In an observed structure of a sputtering surface, an area ratio of crystal grains having a grain size (crystal grain size) of 10 μm or less is 5% to 50% and an area ratio of crystal grains having a grain size of 100 μm or more is 1% to 30%. Further, an average crystal grain size therein is 100 μm or less.

Further, in the Cu—Ga alloy sputtering target according to the present embodiment, when a bending strength is represented by Y (MPa) and a Ga content in the Cu—Ga alloy is represented by X (at %), the following relationship is satisfied.

$$Y \geq -8 \times X + 490$$

In addition, in the Cu—Ga alloy sputtering target according to the present embodiment, a Weibull modulus of bending strengths measured at five or more positions is 20 or more.

In addition, in the Cu—Ga alloy sputtering target according to the present embodiment, a relative density is 99% or higher. A value is obtained by, in a graph in which the vertical axis represents a density and the horizontal axis represents a Ga composition ratio (Ga content), connecting a density $\rho_{Cu}$ of pure copper of 8.96 g/cm$^3$ and a density $\rho_{CuGa}$ of the Cu—Ga alloy (Cu: 69.23 at %, Ga: 30.77 at %) of 8.47 g/cm$^3$ through a straight line and performing interpolation or extrapolation according to the composition of the Cu—Ga alloy (Ga content). Then, the relative density according to the present embodiment is calculated by assuming that the obtained value is 100%.

Next, the method of manufacturing a Cu—Ga alloy sputtering target according to the present embodiment will be described.

Figure 1:
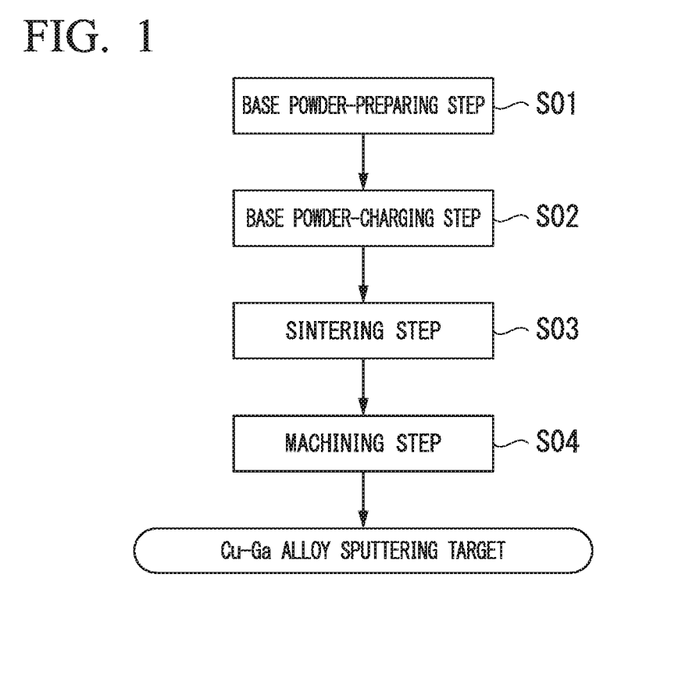
FIG. 1 is a flowchart showing a method of manufacturing a Cu—Ga alloy sputtering target according to an embodiment of the present invention.

As shown in FIG. 1, the method of manufacturing a Cu—Ga alloy sputtering target according to the present embodiment includes: a base powder-preparing step S01 of preparing base powder; a base powder-filling step S02 of filling a cavity formed in a mold with the base powder; a sintering step S03 of heating the base powder to a sintering temperature $T_S$ (° C.) in a vacuum atmosphere to sinter it; and a machining step S04 of machining the obtained sintered body.

(Base Powder-Preparing Step S01)

First, Cu—Ga alloy powder as the base powder is prepared. The Cu—Ga alloy powder may be purchased or may be manufactured using, for example, the following atomizing method.

A massive Cu raw material and a massive Ga raw material are weighed to obtain a predetermined composition and are put into a crucible made of carbon, and this crucible is set in a gas atomization device. After vacuum evacuation, the raw materials are melted by being held at a temperature of 1000° C. to 1200° C. for 1 minute to 30 minutes. Next, while causing the molten alloy to drop through nozzles having a pore size of 1 mm to 3 mm, Ar gas is injected at a gas injection pressure of 10 kgf/cm$^2$ to 50 kgf/cm$^2$. As a result, gas-atomized powder is prepared. The obtained gas-atomized powder is cooled and then classified through a sieve. Thereby, Cu—Ga alloy powder having a predetermined grain size is obtained. Depending on the composition ratio between Cu and Ga, due to its high injection temperature, the molten alloy may reach a chamber before being solidified into powder. In such case, it is preferable that the injection temperature be set to be lower than a heating and holding temperature by about 100° C. to 400° C.

In the Cu—Ga alloy powder manufactured using the above-described atomizing method, an average grain size (average particle size) is 100 μm or less.

In addition, in a grain size distribution of the base powder (Cu—Ga alloy powder), a proportion of grains having a grain size (particle size) of 10 μm or less is 5% to 50% by volume, and a proportion of grains having a grain size of 100 μm or more is 1% to 30% by volume.

(Base Powder-Charging Step S02)

Figure 2:
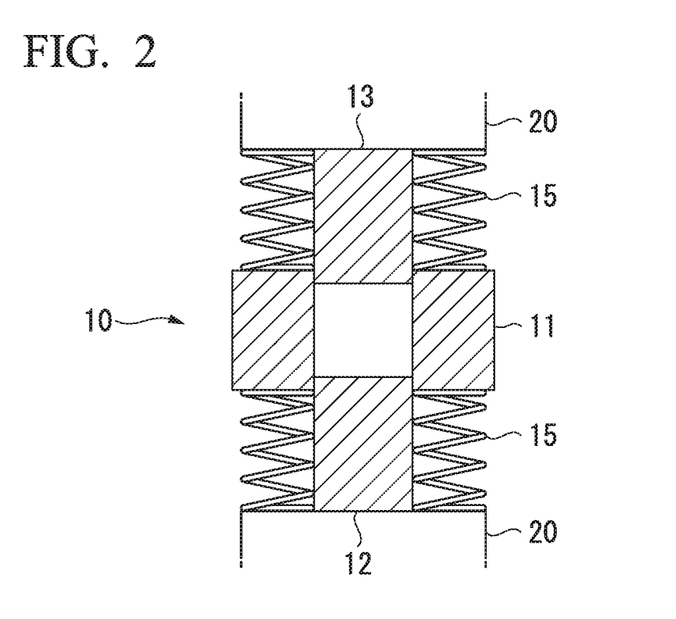
FIG. 2 is a cross-sectional view showing an example of a mold used in the method of manufacturing a Cu—Ga alloy sputtering target according to the embodiment of the present invention.

Next, as shown in FIG. 2, a mold 10 to be filled with the base powder is prepared. In the embodiment, a lower punch 12 is inserted into a lower side of a die 11 having a cylindrical shape. Thereby, a cavity is formed in the mold 10. After filling the mold 10 (the cavity) with the base powder, an upper punch 13 is inserted.

The mold 10 (the die 11, the lower punch 12, and the upper punch 13) is made of a conductive material such as carbon. The die 11 is not necessarily conductive.

(Sintering Step S03)

Next, the filled base powder is heated to the sintering temperature $T_S$ (° C.) and held to be sintered. In the present embodiment, the base powder is pressed with the upper punch 13 and the lower punch 12 using a press machine 20 which also functions as an electrode. At this time, it is preferable that an applied pressure be 1 MPa to 100 MPa. In the embodiment, the sintering is performed in a vacuum atmosphere (pressure: 1000 Pa or lower).

The sintering is performed using a pulsed electric-current pressure sintering method (also known as a spark plasma sintering method) in which an electric current is passed through the base powder to heat the base powder using Joule heat by applying electric power to the upper punch 13 and the lower punch 12 in the vacuum atmosphere. In the embodiment, as shown in FIG. 2, a conductive coil spring 15 as an auxiliary current-carrying member is provided in the vicinity of the lower punch 12 and the upper punch 13 (between an end surface of the press machine 20 and an end surface of the die 11). The press machine 20 and the die 11 are electrically connected through the coil spring 15. A current-carrying area increased by the coil spring 15 is 0.1 times or more of a current-carrying area of the die. During pressing using the press machine 20, the coil spring 15 shrinks between the press machine 20 and the end surface of the die 11, and the press machine 20 and the die 11 are electrically connected through the coil spring 15.

In the embodiment, the sintering temperature $T_S$ (° C.) in the sintering step S03 is set to be in a range of $0.5 \times T_L \leq T_S \leq T_L$ with respect to a liquid phase appearance temperature $T_L$ of a Cu—Ga alloy constituting a Cu—Ga alloy sputtering target to be manufactured.

A holding time at the sintering temperature $T_S$ (° C.) is set to be in a range of 0.5 min to 60 min.

Further, a temperature increase rate is set to be in a range of 5 ° C./min to 75° C./min.

(Machining Step S04)

By machining the sintered body obtained in the sintering step S03, a Cu—Ga alloy sputtering target having a predetermined size is manufactured.

In the Cu—Ga alloy sputtering target according to the embodiment having the above-described configuration, an area ratio of crystal grains having a grain size of 10 μm or less is 5% or higher and an area ratio of crystal grains having a grain size of 100 μm or more is 1% or higher.

Substantially no pores are present in fine crystal grains having a grain size of 10 μm or less. In addition, the number of pores in coarse crystal grains having a grain size of 100 μm or more does not substantially increase although the grain size increases. Therefore, the number of pores per reference area decreases. Accordingly, an area ratio of crystal grains having a grain size of 10 μm or less is 5% or higher and an area ratio of crystal grains having a grain size of 100 μm or more is 1% or higher, whereby the number of pores in the crystal grains can be reduced.

In a Cu—Ga alloy sputtering target made of a sintered body, the bending strength decreases due to the presence of pores on crystal grain boundaries. Therefore, by reducing the number of pores in crystal grains to increase a ratio of the number of pores in crystal grains to the number of pores on crystal grain boundaries (the number of pores in crystal grains/the number of pores on crystal grain boundaries), the bending strength of the Cu—Ga alloy sputtering target can be improved. Thereby, breaking can be suppressed during manufacturing or use.

In the Cu—Ga alloy sputtering target according to the present embodiment, in order to reliably improve the bending strength, it is preferable that the lower limit of the area ratio of crystal grains having a grain size of 10 pm or less be 10%. In addition, it is preferable that the lower limit of the area ratio of crystal grains having a grain size of 100 μm or more be 5%.

In addition, in the Cu—Ga alloy sputtering target according to the embodiment, the carbon concentration is limited to 30 ppm by mass or lower, the area ratio of crystal grains having a grain size of 10 μm or less is limited to 50% or lower, and the area ratio of crystal grains having a grain size of 100 μm or more is 1% or more. Therefore, particle formation can be suppressed during sputtering film formation.

It is considered that carbon contained in the Cu—Ga alloy sputtering target is present on the surface of the base powder. Therefore, by reducing the number of fine crystal grains having a grain size of 10 μm or less and increasing the number of coarse crystal grains having a grain size of 100 μm or more, the length of crystal grain boundaries on a sputtering surface can be reduced, and particle formation can be suppressed. It is preferable that the lower limit of the carbon concentration be 1.0 ppm by mass, and it is more preferable that the carbon concentration be 1.0 ppm by mass to 10 ppm by mass. However, the present invention is not limited to this configuration.

In the Cu—Ga alloy sputtering target according to the present embodiment, in order to reliably suppress particle formation, it is preferable that the upper limit of the area ratio of crystal grains having a grain size of 10 μm or less be 40%. In addition, it is preferable that the lower limit of the area ratio of crystal grains having a grain size of 100 μm or more be 5%.

Further, the area ratio of coarse crystal grains having a grain size of 100 μm or more is limited to 30% or lower. Therefore, even in a case where a sputtering surface is consumed along with the progress of sputtering, no significant unevenness is formed on the sputtering surface, and thus abnormal discharge caused by concentration of electric charges on convex portions can be suppressed.

In addition, in the embodiment, the average crystal grain size of the sputtering surface is 100 μm or less. Therefore, even in a case where the sputtering surface is consumed, no significant unevenness is formed on the sputtering surface, and thus abnormal discharge can reliably be suppressed.

Further, in the embodiment, the oxygen concentration is 150 ppm by mass or lower. Therefore, formation of an oxide in the Cu—Ga alloy sputtering target can be suppressed, and abnormal discharge and particle formation caused by the oxide can be suppressed.

In the Cu—Ga alloy sputtering target according to the present embodiment, in order to reliably suppress abnormal discharge, it is preferable that the upper limit of the area ratio of crystal grains having a grain size of 100 μm or more be 20%.

In addition, the average crystal grain size of the sputtering surface is preferably 75 μm or less. The lower limit of the average crystal grain size is preferably 25 μm, but the present invention is not limited thereto.

Further, the oxygen concentration is preferably 100 ppm by mass or lower. The lower limit of the oxygen concentration is preferably 1.0 ppm by mass, but the present invention is not limited thereto.

In addition, in the Cu—Ga alloy sputtering target according to the embodiment, when the bending strength is represented by Y (MPa) and the Ga content in the Cu—Ga alloy is represented by X (at %), a relationship of $Y \geq \Delta 8 \times X + 490$ is satisfied. Therefore, the bending strength Y is sufficiently higher than that in the related art, and breaking can be suppressed.

Further, in the Cu—Ga alloy sputtering target according to the embodiment, the Weibull modulus of bending strengths measured at five or more positions is 20 or higher.

Therefore, a dispersion in the bending strength of the Cu—Ga alloy sputtering target is small, and breaking can be sufficiently suppressed.

The Weibull modulus is calculated using the following method. When a cumulative probability of fracture of measured samples is represented by F and the bending strength is represented by Y, the Weibull modulus is a slope of measured lines plotted on a graph in which the vertical axis represents $\ln\ln((1-F)^{-1})$ and the horizontal axis represents $\ln(Y)$. The Weibull modulus is preferably 50 or lower and more preferably 30 to 50, but the present invention is not limited thereto.

In addition, in the method of manufacturing a Cu—Ga alloy sputtering target according to the embodiment, in the sintering step S03, the sintering is performed using a pulsed electric-current pressure sintering method (also known as a spark plasma sintering method) in which by applying electric power to the upper punch 13 and the lower punch 12, an electric current is passed through the base powder to heat the base powder by Joule heat. Therefore, the grain size of the base powder becomes the crystal grain size of the Cu—Ga alloy sputtering target without a significant change in the grain size of the base powder.

In the present embodiment, in the base powder-preparing step S01, the grain size distribution of the base powder (Cu—Ga alloy powder) is adjusted such that the proportion of grains having a grain size of 10 μm or less is 5% to 50% by volume and the proportion of grains having a grain size of 100 μm or more is 1% to 30% by volume. Therefore, a Cu—Ga alloy sputtering target can be manufactured in which the area ratio of crystal grains having a grain size of 10 μm or less is limited to 5% to 50% and the area ratio of crystal grains having a grain size of 100 μm or more is 1% to 30%. In the base powder, the proportion of grains having a grain size of 10 μm or less is preferably 10% to 40% by volume, and the proportion of grains having a grain size of 100 μm or more is preferably 2.0% to 20% by volume. However, the present invention is not limited to this configuration.

Further, in the base powder-preparing step S01, the average grain size of the Cu—Ga alloy powder is 100 μm or less. Therefore, a Cu—Ga alloy sputtering target having an average crystal grain size of 100 μm or less can be manufactured. The average grain size of the base powder is preferably 10 μm or more and more preferably 25 μm to 75 μm, but the present invention is not limited thereto.

In addition, in the present embodiment, in the sintering step S03, the sintering is performed using the pulsed electric-current pressure sintering method (also known as a spark plasma sintering method). Therefore, the amount of carbon can be reduced in the sintering step S03. Accordingly, by setting the amount of carbon in the base powder (Cu—Ga alloy powder) to be 140 ppm by mass or lower in the base powder-preparing step S01, a Cu—Ga alloy sputtering target in which the carbon concentration is 30 ppm by mass or lower can be manufactured. The lower limit of the amount of carbon in the base powder is preferably 1.0 ppm by mass and more preferably 1.0 ppm by mass to 20 ppm by mass. However, the present invention is not limited to this configuration.

Further, in the present embodiment, the base powder is sintered using the spark plasma sintering method (SPS) in the vacuum atmosphere (pressure: 1000 Pa or lower). Therefore, the amount of carbon can reliably be reduced.

In order to reliably reduce the amount of carbon in the sintering step S03 to reduce the carbon concentration in the Cu—Ga alloy sputtering target, it is preferable that the vacuum atmosphere in the sintering step S03 be 50 Pa or lower.

Further, in the present embodiment, in the sintering step S03, the sintering temperature $T_S$ is $0.5 \times T_L$ or higher with respect to the liquid phase appearance temperature $T_L$ of a Cu—Ga alloy constituting a Cu—Ga alloy sputtering target to be manufactured, and the holding time is 0.5 min or longer. Therefore, the base powder (Cu—Ga alloy powder) can reliably be sintered. In addition, the sintering temperature $T_S$ is the liquid phase appearance temperature $T_L$ or lower, and the holding time is 60 min or shorter. Therefore, in the sintering step S03, the melting of the base powder (Cu—Ga alloy powder) can be suppressed.

In order to reliably sinter the base powder (Cu—Ga alloy powder), the lower limit of the sintering temperature $T_S$ is preferably $0.7T_L$. In addition, the lower limit of the holding time is preferably 10 min.

In addition, in order to reliably suppress the melting of the base powder (Cu—Ga alloy powder), the upper limit of the sintering temperature $T_S$ is preferably $0.95T_L$. In addition, the upper limit of the holding time is preferably 30 min.

In addition, in the present embodiment, the temperature increase rate in the sintering step S03 is set to be 5° C./min to 75° C./min and more preferably 15° C./min to 50° C./min.

In addition, in the present embodiment, in the sintering step S03, the applied pressure by the upper punch 13 and the lower punch 12 is set to be 1 MPa or higher. Therefore, an electric current can reliably be passed through the base powder (Cu—Ga alloy powder), the base powder can be heated, and thus the base powder (Cu—Ga alloy powder) can be reliably sintered.

Further, the applied pressure by the upper punch 13 and the lower punch 12 is set to be 100 MPa or lower. Therefore, since it is not necessary to use large pressing facilities, a Cu—Ga alloy sputtering target can be efficiently manufactured.

In order to reliably pass an electric current through the base powder (Cu—Ga alloy powder) and sinter it, the lower limit of the applied pressure in the sintering step S03 is preferably 10 MPa.

In addition, in order to more efficiently manufacture the Cu—Ga alloy sputtering target, the upper limit of the applied pressure in the sintering step S03 is preferably 70 MPa.

Further, in the embodiment, in the sintering step S03, the coil spring 15 as the auxiliary current-carrying member is provided in the vicinity of the lower punch 12 and the upper punch 13. The press machine 20 and the die 11 are electrically connected through the coil spring 15. Therefore, a difference in the amount of Joule heat generated between a region where only the lower punch 12 and the upper punch 13 are provided and a region where the die 11 is provided can be suppressed from significantly increasing, and a difference in temperature therebetween can be suppressed to be small.

Thereby, the local formation of a portion where sintering is insufficient can be suppressed, and the bending strength can be significantly improved. In addition, a dispersion in the bending strength can also be suppressed.

Hereinabove, the embodiment of the present invention has been described. However, the present invention is not limited to the embodiment, and various modifications can be made within a range not departing from the technical ideas of the present invention.

For example, in the description of the embodiment, the Cu—Ga alloy sputtering target is used when a Cu—Ga alloy thin film is formed by sputtering in order to form a light-absorbing layer made of a Cu—In—Ga—Se quaternary alloy thin film in a solar cell. However, the present invention is not limited to this configuration, and the Cu—Ga alloy sputtering target may be used for another application.

In addition, the shape and size of the Cu—Ga alloy sputtering target are not particularly limited and, for example, may be a rectangular shape, a disk shape, or a cylindrical shape.

Figure 3:
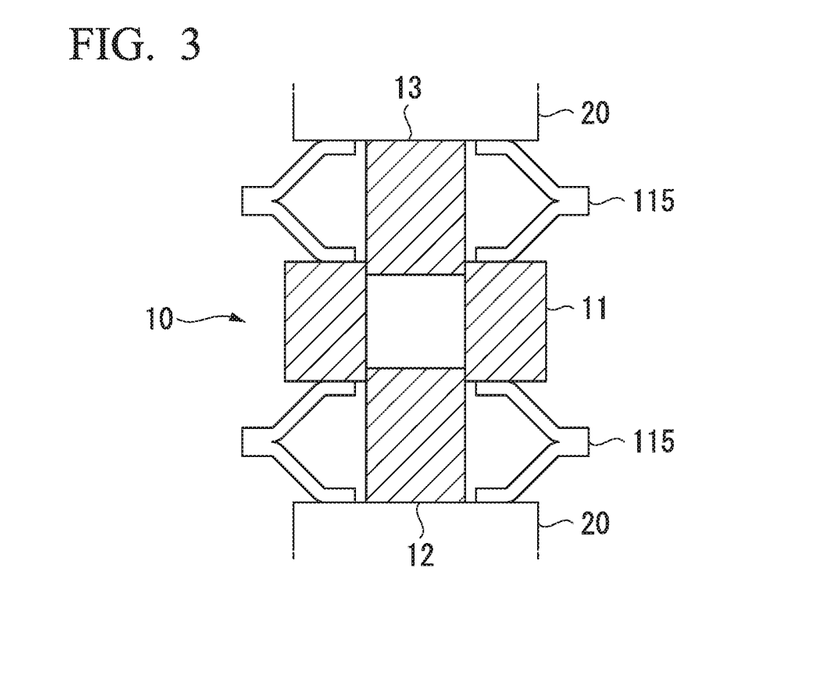
FIG. 3 is a cross-sectional view showing an example of a mold used in a method of manufacturing a Cu—Ga alloy sputtering target according to another embodiment of the present invention.
Figure 4:
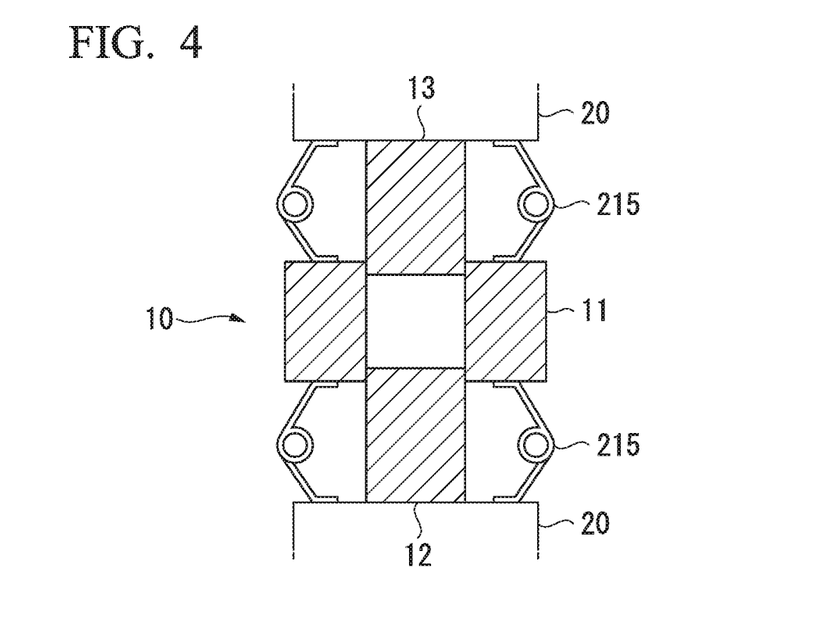
FIG. 4 is a cross-sectional view showing an example of a mold used in a method of manufacturing a Cu—Ga alloy sputtering target according to still another embodiment of the present invention.
Figure 5:
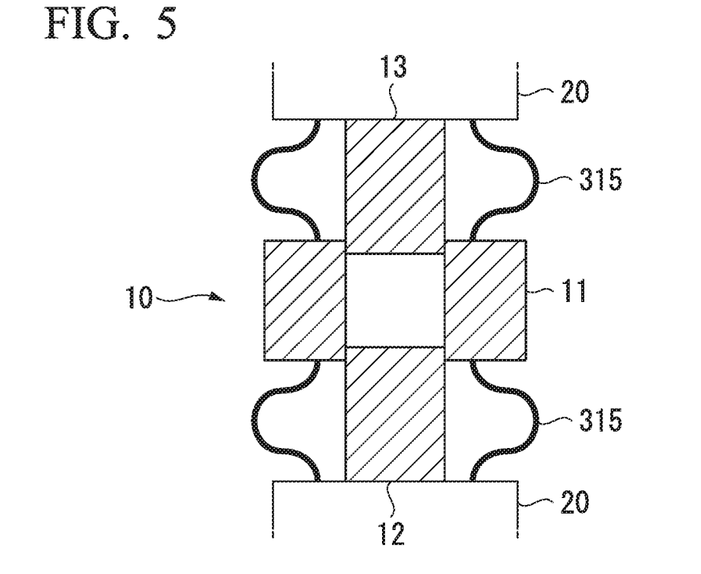
FIG. 5 is a cross-sectional view showing an example of a mold used in a method of manufacturing a Cu—Ga alloy sputtering target according to still another embodiment of the present invention.
Figure 6:
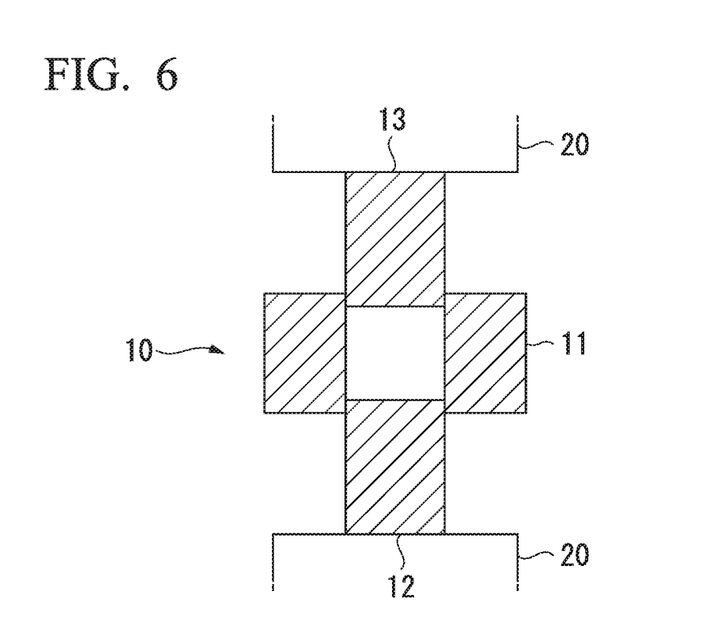
FIG. 6 is a cross-sectional view showing an example of a mold used in a method of manufacturing a Cu—Ga alloy sputtering target according to still another embodiment of the present invention.

Further, in the description of the present embodiment, as shown in FIG. 2, the coil spring 15 as the auxiliary current-carrying member is provided in the vicinity of the upper punch 13 and the lower punch 12. However, the present invention is not limited to this configuration, and a leaf spring 115 may be provided as shown in FIG. 3, or a pinch spring 215 may be provided as shown in FIG. 4. In addition, as shown in FIG. 5, a conductive wire 315 may be provided. In addition, as shown in FIG. 6, the auxiliary current-carrying member is not necessarily provided.

EXAMPLES

The results of an experiment, which was performed to verify the effects of the Cu—Ga alloy sputtering target and the method of manufacturing a Cu—Ga alloy sputtering target according to the present invention, will be described.

Example 1

First, base powders (Cu—Ga alloy powders) having compositions and grain size distributions shown in Tables 1 and 2 were prepared.

Each of the base powders filled a mold. The molds (die, upper punch, and lower punch) made of a material shown in Tables 3 and 4 were used. Sintering was performed using a spark plasma sintering method under conditions shown in Tables 3 and 4. As shown in FIG. 6, the auxiliary current-carrying member was not used.

The size of the obtained Cu—Ga alloy sputtering target (sintered body) was φ100 mm×10 mmt.

In addition, in Comparative Example 10, the base powder shown in Table 2 was sintered by hot pressing to manufacture a Cu—Ga alloy sputtering target.

In Comparative Example 11, the base powder shown in Table 2 was used through a casting method to manufacture a Cu—Ga alloy sputtering target.

In Comparative Example 12, the base powder shown in Table 2 was sintered using a hot isostatic pressing (HIP) method to manufacture a Cu—Ga alloy sputtering target.

Table 4 shows preparation conditions of Comparative Examples 10, 11, and 12.

Regarding each of the obtained Cu—Ga alloy sputtering targets, the relative density, the oxygen concentration, the carbon concentration, the average crystal grain size, the area ratio of crystal grains having a grain size of 10 μm or less, the area ratio of crystal grains having a grain size of 100 μm or more, the bending strength, the number of particles formed during sputtering film formation, and the number of times of abnormal discharge were evaluated as follows.

(Relative Density)

The density was measured using the Archimedes' method. A value is obtained by connecting a density $\rho_{Cu}$ of pure copper of 8.96 g/cm$^3$ and a density $\rho_{CuGa}$ of the Cu—Ga alloy (Cu: 69.23 at %, Ga: 30.77 at %) of 8.47 g/cm$^3$ through a straight line and performing interpolation or extrapolation according to the composition of the Cu—Ga alloy (Ga content). Then, the relative density was calculated by assuming that the obtained value is 100%. The evaluation results are shown in Tables 5 and 6.

(Oxygen Concentration)

The oxygen concentration was measured using an infrared absorption method described in "General Rules for Determination of Oxygen in Metallic Materials" of JIS Z 2613. The measurement results are shown in Tables 5 and 6.

(Carbon Concentration)

The carbon concentration was measured using an infrared absorption method described in "General Rules for Determination of Carbon in Metallic Materials" of HS Z 2615. The measurement results are shown in Tables 5 and 6.

(Crystal Grain Size)

A sputtering surface was polished, was etched with nitric acid, and then was observed with an optical microscope. The measurement magnification was 250 times, and the observed area was 7.5 mm$^2$ or more. The crystal grain sizes of crystal grains were measured by line segment method, and the average crystal grain size, the area ratio of crystal grains having a grain size of 10 μm or less, and the area ratio of crystal grains having a grain size of 100 μm or more were calculated. The area ratio was calculated by drawing a square lattice where the interval between the lines is comparative with 5 μm on a printed micrograph of the structure and counting the number of squares contained in each grain. The evaluation results are shown in Tables 5 and 6.

(Bending Strength)

The sintered body was divided into three portions in a thickness direction (direction in which the upper punch and the lower punch pressed), five specimens (3 mm×4 mm×35 mm) were collected from a center portion in the thickness direction, and a stress trajectory was measured at an indentation speed of 0.5 mm/min using Autograph AG-X (manufactured by Shimadzu Corporation). A maximum point stress of an elastic area was obtained, and the bending strength was evaluated based on the average value of the five specimens. The evaluation results are shown in Tables 5 and 6.

(Sputtering Conditions)

Using a magnetron sputtering device, a Cu—Ga alloy film having a thickness of 100 nm was formed on a substrate having a diameter of φ100 mm by direct current (DC) sputtering under conditions of input power: 3.3 W/cm$^2$ and 10 min. During sputtering, the Ar flow rate was 30 sccm, and the pressure was 0.67 Pa.

(Number of Particles)

The number of particles having a diameter of 0.3 μm or more present in the formed Cu—Ga alloy film was measured using a particle counter. The evaluation results are shown in Tables 5 and 6.

(Abnormal Discharge)

After performing sputtering under the above-described sputtering conditions for 10 minutes, the number of times of abnormal discharge was measured by visual inspection. The measurement results are shown in Tables 5 and 6.

TABLE 1

| | Base powder | | | | | |
|---|---|---|---|---|---|---|
| | Ga concentration (at %) | Liquid phase appearance temperature $T_L$ (° C.) | Carbon concentration (ppm by mass) | Average grain size (μm) | Proportion of 10 μm or less (%) | Proportion of 100 μm or more (%) |
| Example 1 | 20 | 915 | 95 | 30 | 23 | 12 |
| Example 2 | 30 | 836 | 90 | 25 | 25 | 10 |
| Example 3 | 40 | 400 | 140 | 22 | 27 | 8 |
| Example 4 | 30 | 836 | 50 | 25 | 25 | 10 |
| Example 5 | 30 | 836 | 70 | 90 | 15 | 20 |
| Example 6 | 30 | 836 | 90 | 25 | 25 | 10 |
| Example 7 | 30 | 836 | 90 | 20 | 5 | 1 |
| Example 8 | 30 | 836 | 80 | 30 | 5 | 30 |
| Example 9 | 30 | 836 | 120 | 15 | 50 | 1 |
| Example 10 | 30 | 836 | 100 | 18 | 50 | 30 |
| Example 11 | 30 | 836 | 90 | 25 | 25 | 10 |
| Example 12 | 30 | 836 | 90 | 25 | 25 | 10 |
| Example 13 | 30 | 836 | 90 | 25 | 25 | 10 |
| Example 14 | 30 | 836 | 90 | 25 | 25 | 10 |
| Example 15 | 30 | 836 | 90 | 25 | 25 | 10 |
| Example 16 | 30 | 836 | 90 | 25 | 25 | 10 |

TABLE 2

| | Base powder | | | | | |
|---|---|---|---|---|---|---|
| | Ga concentration (at %) | Liquid phase appearance temperature $T_L$ (° C.) | Carbon concentration (ppm by mass) | Average grain size (μm) | Proportion of 10 μm or less (%) | Proportion of 100 μm or more (%) |
| Comparative example 1 | 30 | 836 | 180 | 20 | 28 | 7 |
| Comparative example 2 | 30 | 836 | 90 | 25 | 25 | 0.5 |
| Comparative example 3 | 30 | 836 | 90 | 25 | 25 | 50 |
| Comparative example 4 | 30 | 836 | 90 | 25 | 3 | 0.5 |
| Comparative example 5 | 30 | 836 | 90 | 25 | 3 | 10 |
| Comparative example 6 | 30 | 836 | 90 | 25 | 3 | 50 |
| Comparative example 7 | 30 | 836 | 90 | 25 | 60 | 0.5 |
| Comparative example 8 | 30 | 836 | 90 | 25 | 60 | 10 |
| Comparative example 9 | 30 | 836 | 90 | 25 | 60 | 50 |
| Comparative example 10 | 30 | 836 | 90 | 25 | 25 | 10 |
| Comparative example 11 | 30 | 836 | 90 | 25 | 25 | 10 |
| Comparative example 12 | 30 | 836 | 90 | 25 | 25 | 10 |

TABLE 3

| | Sintering conditions | | | | | | | |
|---|---|---|---|---|---|---|---|---|
| | | Material of | Atmosphere | | Sintering pressure | Temperature increase rate | Sintering temperature | Holding time |
| | Manufacturing method | mold | Component | Pressure (Pa) | (MPa) | (° C./min) | (° C.) | (min) |
| Example 1 | Pulsed electric-current pressure sintering | Carbon | Vacuum | 10 | 20 | 30 | 700 | 10 |
| Example 2 | Pulsed electric-current pressure sintering | Carbon | Vacuum | 10 | 20 | 30 | 650 | 10 |
| Example 3 | Pulsed electric-current pressure sintering | Carbon | Vacuum | 10 | 20 | 30 | 350 | 10 |
| Example 4 | Pulsed electric-current pressure sintering | Carbon | Vacuum | 10 | 20 | 30 | 650 | 10 |
| Example 5 | Pulsed electric-current pressure sintering | Carbon | Vacuum | 10 | 20 | 30 | 650 | 10 |
| Example 6 | Pulsed electric-current pressure sintering | Carbon | Vacuum | 900 | 20 | 30 | 650 | 10 |

TABLE 3-continued

| | | | Sintering conditions | | | | | |
|---|---|---|---|---|---|---|---|---|
| | | Material of | Atmosphere | | Sintering pressure | Temperature increase rate | Sintering temperature | Holding time |
| | Manufacturing method | mold | Component | Pressure (Pa) | (MPa) | (° C./min) | (° C.) | (min) |
| Example 7 | Pulsed electric-current pressure sintering | Carbon | Vacuum | 10 | 20 | 30 | 650 | 10 |
| Example 8 | Pulsed electric-current pressure sintering | Carbon | Vacuum | 10 | 20 | 30 | 650 | 10 |
| Example 9 | Pulsed electric-current pressure sintering | Carbon | Vacuum | 10 | 20 | 30 | 650 | 10 |
| Example 10 | Pulsed electric-current pressure sintering | Carbon | Vacuum | 10 | 20 | 30 | 650 | 10 |
| Example 11 | Pulsed electric-current pressure sintering | Carbon | Vacuum | 10 | 1 | 30 | 650 | 10 |
| Example 12 | Pulsed electric-current pressure sintering | Carbon | Vacuum | 10 | 100 | 30 | 650 | 10 |
| Example 13 | Pulsed electric-current pressure sintering | Carbon | Vacuum | 10 | 20 | 5 | 650 | 10 |
| Example 14 | Pulsed electric-current pressure sintering | Carbon | Vacuum | 10 | 20 | 75 | 650 | 10 |
| Example 15 | Pulsed electric-current pressure sintering | Carbon | Vacuum | 10 | 20 | 30 | 800 | 0.5 |
| Example 16 | Pulsed electric-current pressure sintering | Carbon | Vacuum | 10 | 20 | 30 | 600 | 60 |

TABLE 4

| | | | Sintering conditions | | | | | |
|---|---|---|---|---|---|---|---|---|
| | | Material of | Atmosphere | | Sintering pressure | Temperature increase rate | Sintering temperature | Holding time |
| | Manufacturing method | mold | Component | Pressure (Pa) | (MPa) | (° C./min) | (° C.) | (min) |
| Comparative example 1 | Pulsed electric-current pressure sintering | Carbon | Vacuum | 10 | 20 | 30 | 650 | 10 |
| Comparative example 2 | Pulsed electric-current pressure sintering | Carbon | Vacuum | 10 | 20 | 30 | 650 | 10 |
| Comparative example 3 | Pulsed electric-current pressure sintering | Carbon | Vacuum | 10 | 20 | 30 | 650 | 10 |
| Comparative example 4 | Pulsed electric-current pressure sintering | Carbon | Vacuum | 10 | 20 | 30 | 650 | 10 |
| Comparative example 5 | Pulsed electric-current pressure sintering | Carbon | Vacuum | 10 | 20 | 30 | 650 | 10 |
| Comparative example 6 | Pulsed electric-current pressure sintering | Carbon | Vacuum | 10 | 20 | 30 | 650 | 10 |
| Comparative example 7 | Pulsed electric-current pressure sintering | Carbon | Vacuum | 10 | 20 | 30 | 650 | 10 |
| Comparative example 8 | Pulsed electric-current pressure sintering | Carbon | Vacuum | 10 | 20 | 30 | 650 | 10 |
| Comparative example 9 | Pulsed electric-current pressure sintering | Carbon | Vacuum | 10 | 20 | 30 | 650 | 10 |
| Comparative example 10 | Hot pressing | Carbon | Vacuum | 10 | 35 | 5 | 700 | 60 |
| Comparative example 11 | Casting | — | — | 10 | — | — | — | — |
| Comparative example 12 | HIP | Carbon | Vacuum | 10 | 100 | 5 | 700 | 60 |

TABLE 5

| | Evaluation | | | | | | | | |
|---|---|---|---|---|---|---|---|---|---|
| | Relative density (%) | Oxygen concentration (ppm by mass) | Carbon concentration (ppm by mass) | Average crystal grain size (μm) | Proportion of 10 μm or less (%) | Proportion of 100 μm or more (%) | Bending strength (MPa) | Number of particles (pieces) | Abnormal discharge (times/h) |
| Example 1 | 99.8 | 120 | 25 | 30 | 23 | 12 | 220 | 6 | 0 |
| Example 2 | 99.9 | 110 | 20 | 25 | 25 | 10 | 195 | 6 | 0 |
| Example 3 | 99.6 | 130 | 25 | 22 | 27 | 8 | 155 | 5 | 0 |
| Example 4 | 99.9 | 90 | <10 | 25 | 25 | 10 | 210 | 1 | 0 |
| Example 5 | 99.9 | 80 | 15 | 90 | 15 | 20 | 200 | 3 | 0 |
| Example 6 | 99.1 | 150 | 25 | 25 | 25 | 10 | 190 | 7 | 0 |
| Example 7 | 99.7 | 70 | 20 | 20 | 5 | 1 | 195 | 3 | 0 |
| Example 8 | 99.9 | 65 | 20 | 30 | 5 | 30 | 198 | 4 | 0 |
| Example 9 | 99.8 | 90 | 25 | 15 | 50 | 1 | 200 | 2 | 0 |
| Example 10 | 99.8 | 80 | 20 | 18 | 50 | 30 | 195 | 3 | 0 |

TABLE 5-continued

| | Evaluation | | | | | | | | |
|---|---|---|---|---|---|---|---|---|---|
| | Relative density (%) | Oxygen concentration (ppm by mass) | Carbon concentration (ppm by mass) | Average crystal grain size (μm) | Proportion of 10 μm or less (%) | Proportion of 100 μm or more (%) | Bending strength (MPa) | Number of particles (pieces) | Abnormal discharge (times/h) |
| Example 11 | 99.1 | 100 | 20 | 25 | 25 | 10 | 142 | 5 | 0 |
| Example 12 | 99.9 | 100 | 20 | 25 | 25 | 10 | 210 | 2 | 0 |
| Example 13 | 99.9 | 105 | 20 | 25 | 25 | 10 | 205 | 5 | 0 |
| Example 14 | 99.7 | 100 | 20 | 25 | 25 | 10 | 190 | 4 | 0 |
| Example 15 | 99.5 | 95 | 20 | 25 | 25 | 10 | 180 | 3 | 0 |
| Example 16 | 99.0 | 100 | 20 | 100 | 10 | 25 | 160 | 5 | 0 |

TABLE 6

| | Evaluation | | | | | | | | |
|---|---|---|---|---|---|---|---|---|---|
| | Relative density (%) | Oxygen concentration (ppm by mass) | Carbon concentration (ppm by mass) | Average crystal grain size (μm) | Proportion of 10 μm or less (%) | Proportion of 100 μm or more (%) | Bending strength (MPa) | Number of particles (pieces) | Abnormal discharge (times/h) |
| Comparative example 1 | 99.9 | 110 | 35 | 25 | 28 | 7 | 180 | 15 | 2 |
| Comparative example 2 | 99.6 | 100 | 20 | 25 | 25 | 0.5 | 120 | 8 | 0 |
| Comparative example 3 | 99.8 | 95 | 20 | 25 | 25 | 50 | 190 | 7 | 5 |
| Comparative example 4 | 99.9 | 95 | 20 | 25 | 3 | 0.5 | 124 | 6 | 0 |
| Comparative example 5 | 99.9 | 105 | 20 | 25 | 3 | 10 | 110 | 7 | 0 |
| Comparative example 6 | 99.9 | 90 | 20 | 25 | 3 | 50 | 160 | 4 | 2 |
| Comparative example 7 | 99.5 | 95 | 20 | 25 | 60 | 0.5 | 190 | 37 | 0 |
| Comparative example 8 | 99.4 | 110 | 20 | 25 | 60 | 10 | 200 | 39 | 0 |
| Comparative example 9 | 99.7 | 100 | 20 | 25 | 60 | 50 | 185 | 36 | 9 |
| Comparative example 10 | 99.5 | 400 | 40 | 120 | 3 | 35 | 203 | 19 | 1 |
| Comparative example 11 | 99.9 | 50 | 10 | 530 | 0 | 90 | 196 | 9 | 3 |
| Comparative example 12 | 99.8 | 110 | 80 | 100 | 3 | 35 | 238 | 30 | 4 |

It was found that, in Comparative Example 1 in which the amount of carbon was 35 ppm by mass, a large number of particles were formed during sputtering film formation and abnormal discharge occurred.

It was found that the bending strength was low in Comparative Example 2 in which the area ratio of crystal grains having a grain size of 100 μm or more was 0.5%, in Comparative Example 4 in which the area ratio of crystal grains having a grain size of 10 μm or less was 3% and the area ratio of crystal grains having a grain size of 100 μm or more was 0.5%, and in Comparative Example 5 in which the area ratio of crystal grains having a grain size of 10 μm or less was 3%.

It was found that abnormal discharge occurred many times in Comparative Example 3 in which the area ratio of crystal grains having a grain size of 100 μm or more was 50%, in Comparative Example 6 in which the area ratio of crystal grains having a grain size of 10 μm or less was 3% and the area ratio of crystal grains having a grain size of 100 μm or more was 50%, and in Comparative Example 9 in which the area ratio of crystal grains having a grain size of 10 μm or less was 60% and the area ratio of crystal grains having a grain size of 100 μm or more was 50%.

It was found that the number of particles was large in Comparative Example 7 in which the area ratio of crystal grains having a grain size of 10 μm or less was 60% and the area ratio of crystal grains having a grain size of 100 μm or more was 0.5%, in Comparative Example 8 in which the area ratio of crystal grains having a grain size of 10 μm or less was 60% and the area ratio of crystal grains having a grain size of 100 μm or more was 10%, and in Comparative Example 9 in which the area ratio of crystal grains having a grain size of 10 μm or less was 60% and the area ratio of crystal grains having a grain size of 100 μm or more was 50%.

In Comparative Example 10 in which the sintering was performed by hot pressing, the amount of oxygen and the amount of carbon were large, the number of particles was large, and abnormal discharge occurred.

In Comparative Example 11 in which the target was manufactured through a casting method, no crystal grains having a grain size of 10 μm or less were present, the average crystal grain size was extremely large, and abnormal discharge occurred.

In Comparative Example 12 in which the sintering was performed using a hot isostatic pressing (HIP) method, the amount of carbon was large, the area ratio of crystal grains having a grain size of 10 μm or less and the area ratio of crystal grains having a grain size of 100 μm or more were outside of the range of the present invention, the number of particles was large, and abnormal discharge occurred.

On the other hand, in Examples 1 to 16, the bending strength was high at 150 MPa or higher, the number of particles was suppressed to be 7 or less, and the number of times of abnormal discharge was 0.

Based on the above-described results, it was found that, according to Examples, a Cu—Ga alloy sputtering target in which bending strength is high and breaking can be suppressed and in which abnormal discharge and particle formation can be suppressed during sputtering film formation, and a method of manufacturing the Cu—Ga alloy sputtering target can be provided.

Example 2

Next, when the sintering was performed using a spark plasma sintering method under the conditions shown in Tables 3 and 4 in each of Examples 1 to 16, a coil spring made of carbon was used as an auxiliary current-carrying member as shown in FIG. 2. The current-carrying area of the auxiliary current-carrying member was 0.2 times of the current-carrying area of the die.

The bending strength was measured under the same conditions as those of Example 1. In addition, the Weibull modulus was obtained from measured values of five specimens. The evaluation results are shown in Table 7. Table 7 also shows a Ga concentration X (at %) and a lower limit value $Y_0$ of a bending strength Y shown in the following Expression (1) using the Ga concentration X.

$$Y_0 = -8 \times X + 490 \quad (1)$$

Based on the above-described results, it was found that, by using the auxiliary current-carrying member during pulsed electric-current sintering, a Cu—Ga alloy sputtering target having a high bending strength can be provided.

INDUSTRIAL APPLICABILITY

In the Cu—Ga alloy sputtering target according to the present invention, breaking can be suppressed during manufacturing or use, and abnormal discharge and particle formation can be suppressed during sputtering film formation. Therefore, the Cu—Ga alloy sputtering target according to the present invention is suitable as a sputtering target which is used for forming a light-absorbing layer in a CIGS thin-film solar cell or the like.

REFERENCE SIGNS LIST

S03: SINTERING STEP
10: MOLD
11: DIE
12: LOWER PUNCH (PUNCH)
13: UPPER PUNCH (PUNCH)
15: COIL SPRING (AUXILIARY CURRENT-CARRYING MEMBER)

The invention claimed is:
1. A Cu—Ga alloy sputtering target made of a Cu—Ga alloy,
wherein a carbon concentration is 1.0 ppm by mass or more and 30 ppm by mass or lower,
in an observed structure of the Cu—Ga alloy sputtering target surface with an optical microscope, an area ratio of crystal grains having a grain size of 10 μm or less is 5% to 50% and an area ratio of crystal grains having a grain size of 100 μm or more is 1% to 30%, and

TABLE 7

|  | Ga concentration (at %) | Expression (1)* | Auxiliary energization member not used | | Auxiliary energization member used | |
|---|---|---|---|---|---|---|
|  |  |  | Bending strength (MPa) | Weibull modulus | Bending strength (MPa) | Weibull modulus |
| Example 1 | 20 | 330 | 220 | 16 | 391 | 29 |
| Example 2 | 30 | 250 | 195 | 19 | 268 | 34 |
| Example 3 | 40 | 170 | 155 | 17 | 203 | 31 |
| Example 4 | 30 | 250 | 210 | 19 | 280 | 28 |
| Example 5 | 30 | 250 | 200 | 16 | 281 | 36 |
| Example 6 | 30 | 250 | 190 | 14 | 258 | 22 |
| Example 7 | 30 | 250 | 195 | 17 | 267 | 36 |
| Example 8 | 30 | 250 | 198 | 15 | 277 | 27 |
| Example 9 | 30 | 250 | 200 | 16 | 276 | 35 |
| Example 10 | 30 | 250 | 195 | 13 | 273 | 37 |
| Example 11 | 30 | 250 | 142 | 14 | 251 | 38 |
| Example 12 | 30 | 250 | 210 | 16 | 269 | 22 |
| Example 13 | 30 | 250 | 205 | 16 | 256 | 34 |
| Example 14 | 30 | 250 | 190 | 14 | 263 | 27 |
| Example 15 | 30 | 250 | 180 | 17 | 259 | 27 |
| Example 16 | 30 | 250 | 160 | 15 | 252 | 30 |

*Expression (1) $Y_0 = -8 \times X + 490$ X represents a Ga concentration (at %), and $Y_0$ represents a bending strength (MPa)

In a case where the auxiliary current-carrying member was used, the bending strength was significantly improved as compared to a case where the auxiliary current-carrying member was not used. In addition, the Weibull modulus increased, and a dispersion in bending strength was suppressed. Further, in a case where the auxiliary current-carrying member was used, the bending strength calculated from Expression (1) increased.

the area ratio of crystal grains having a grain size of 10 μm or less is 5% to 50% and the area ratio of crystal grains having a grain size of 100 μm or more is 1% to 30% being determined by observing the Cu—Ga alloy sputtering target surface which was polished with the optical microscope, measuring the crystal grain sizes of crystal grains by line segment method, and calculating the area ratio of crystal grains having a grain size of 10

μm or less, and the area ratio of crystal grains having a grain size of 100 μm or more.

2. The Cu—Ga alloy sputtering target according to claim 1, wherein an average crystal grain size is 100 μm or less.

3. The Cu—Ga alloy sputtering target according to claim 1, wherein an oxygen concentration is 0 ppm by mass or more and 150 ppm by mass or lower.

4. The Cu—Ga alloy sputtering target according to claim 2, wherein an oxygen concentration is 0.1 ppm by mass or more and 150 ppm by mass or lower.

* * * * *